US006961674B2

(12) United States Patent
Gedamu et al.

(10) Patent No.: US 6,961,674 B2
(45) Date of Patent: Nov. 1, 2005

(54) SYSTEM AND METHOD FOR ANALYSIS OF CACHE ARRAY TEST DATA

(75) Inventors: Elias Gedamu, Calgary (CA); Denise Man, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 178 days.

(21) Appl. No.: 10/638,561

(22) Filed: Aug. 11, 2003

(65) Prior Publication Data

US 2005/0038633 A1 Feb. 17, 2005

(51) Int. Cl.[7] .......................................... G06F 11/00
(52) U.S. Cl. ................................... 702/183; 324/73.1
(58) Field of Search ................................ 702/183, 182, 702/184, 185, 118; 324/158.1, 73.1, 754; 365/201

(56) References Cited

U.S. PATENT DOCUMENTS

| 5,325,309 | A | 6/1994 | Halaviati et al. ........... 364/488 |
| 5,497,079 | A | 3/1996 | Yamada et al. .......... 324/158.1 |
| 5,682,472 | A | 10/1997 | Brehm et al. .......... 395/183.01 |
| 5,777,901 | A | 7/1998 | Berezin et al. ............. 364/578 |
| 5,937,154 | A | 8/1999 | Tegethoff ............... 395/183.06 |
| 5,991,215 | A | 11/1999 | Brunelle ..................... 365/201 |
| 6,058,055 | A | 5/2000 | Brunelle ..................... 365/201 |
| 6,362,013 | B1 | 3/2002 | Yoshimura ................... 438/14 |
| 6,433,561 | B1 | 8/2002 | Satya et al. ................. 324/753 |
| 6,477,685 | B1 | 11/2002 | Lovelace ....................... 716/4 |
| 6,574,760 | B1 | 6/2003 | Mydill ....................... 714/724 |
| 2002/0052053 | A1 | 5/2002 | Ono et al. .................... 438/12 |
| 2002/0091979 | A1 | 7/2002 | Cooke et al. ............... 714/733 |
| 2002/0199142 | A1 | 12/2002 | Gefen ........................ 714/724 |
| 2003/0005376 | A1 | 1/2003 | Lee et al. ................... 714/724 |
| 2003/0055592 | A1 | 3/2003 | Buckheit et al. ............ 702/120 |
| 2003/0093729 | A1 | 5/2003 | Suzuki et al. ............... 714/724 |

Primary Examiner—Carol S. W. Tsai
Assistant Examiner—Edward Raymond

(57) ABSTRACT

One embodiment of a method for analysis of cache array test data comprises retrieving test results for a current period of time for a first plurality of storage elements and for a historical period of time for a second plurality of storage elements; determining a plurality of attributes for each of the first storage elements and the second storage elements based upon the test results, the attributes comprising one of a good condition, a defective condition, a repairable condition and a repaired condition; determining a plurality of attribute statistics corresponding to the attributes of the first storage elements and the second storage elements; and generating an output report indicating at least two of the attribute statistics of the first storage elements and the second storage elements.

23 Claims, 4 Drawing Sheets

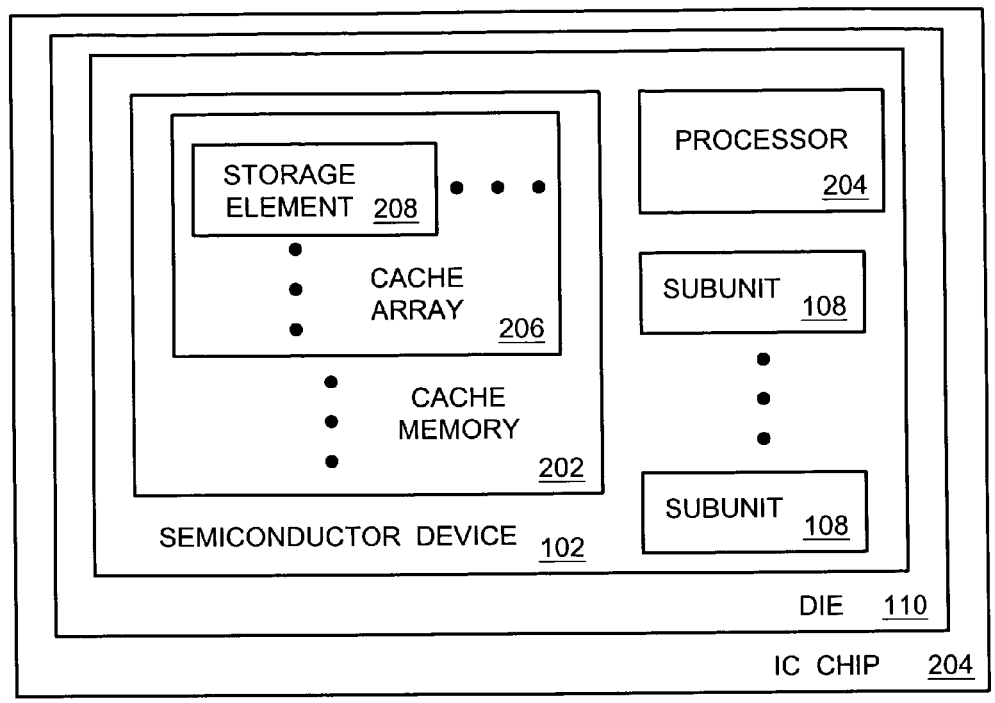
FIG. 2
FIG. 4
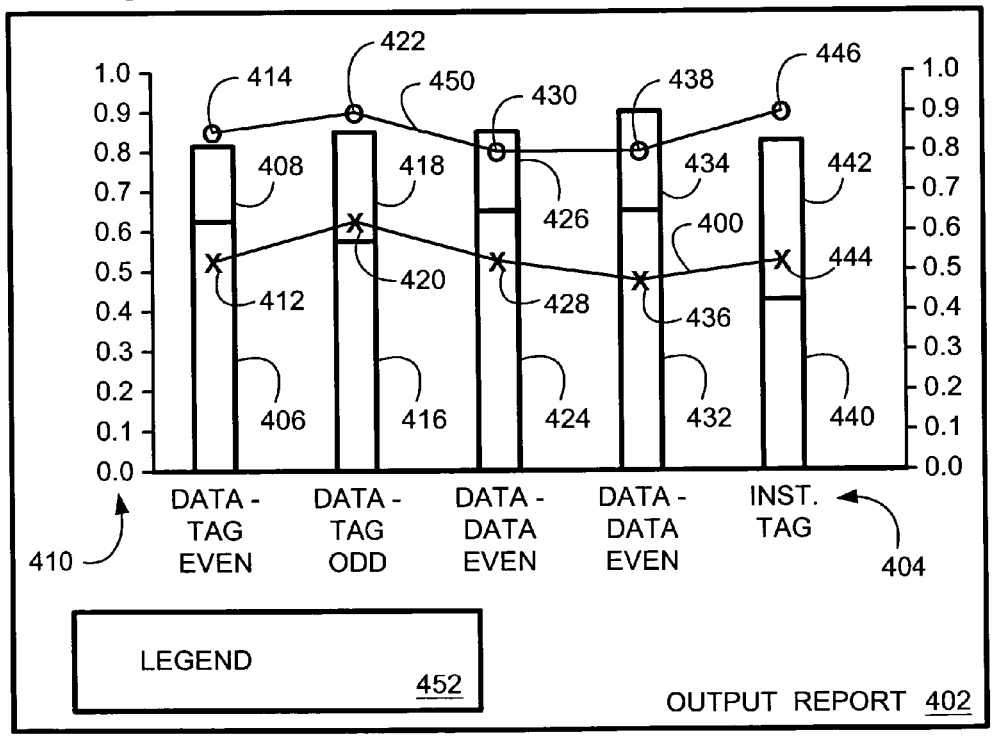

SYSTEM AND METHOD FOR ANALYSIS OF CACHE ARRAY TEST DATA

CROSS REFERENCE TO RELATED APPLICATIONS

This application is related to co-pending U.S. utility application entitled, "SYSTEM AND METHOD FOR ANALYSIS OF CACHE ARRAY TEST DATA," having Ser. No. 10/638,568, filed on Aug. 11, 2003, which is entirely incorporated herein by reference.

BACKGROUND

FIG. 1 is a simplified exemplary diagram of a fabricated wafer 100 having a plurality of semiconductor devices 102 occupying regions 104 of the wafer 100. That is, a single semiconductor device 102 can be found in region 106 of the wafer 100. Typically, semiconductor devices 102 in regions 104 are designed as identical units, thereby facilitating mass production of many semiconductor devices 102.

After fabrication of wafer 100, a variety of testing may be done on the wafer 100 to identify semiconductor devices 102 that are defective. Such testing may be of a "non-contact" nature. For example, incident light may be used to identify manufacturing defects such as thin or thick areas indicating out-of-tolerance regions on the wafer 100.

Or, testing may be of a "contact" nature wherein a probe device (not shown) is coupled to one or more semiconductor devices 102 on wafer 100. Probe contacts are in frictional contact with terminals of a tested semiconductor device 102, referred to as a device under test (DUT), so that a variety of electrical signals are applied to the DUT semiconductor device 102. Output signals from the DUT semiconductor device 102 are then analyzed and compared with expected designed output signals. Defective semiconductor devices 102 are identified when the test output signals do not correspond with the expected designed output signals.

Probe devices have been designed to test individual semiconductor devices 102. Other probe devices are designed to simultaneously test many semiconductor devices. For example, functionality of a processing unit may be verified by applying a test signal pattern and comparing the output of the processing unit with expected designed output signals.

After testing of wafer 100, the individual semiconductor devices 102 are separated from each other, referred to as singulation. The resultant individual semiconductor device 102 residing on a portion of the wafer is referred to as a die 110. Dies 110 passing the wafer testing process are then mounted on a substrate and encapsulated with a protective cover. The resultant device is referred to as an integrated circuit (IC) chip 112. It is understood that the IC chip 112 having an encapsulated semiconductor device 102 may have a plurality of discrete subunits 108. For example, an IC chip 112 may include a processing unit and one or more associated cache memories, or may be a single unit, such as a memory device.

Typically, a "burn-in" process is used to identify IC chips 112 that would otherwise likely fail after a short period of use. Burn-in processes may vary, but generally consist of operating the IC chip 112 while the IC chip 112 is heated to temperatures above expected normal operating conditions. In some burn-in processes, further testing may occur. Accordingly, a variety of electrical signals are applied to the IC chip 112. Output signals are then analyzed and compared with expected designed output signals. Defective IC chips 112 are identified when the test output signals do not correspond with the expected designed output signals.

The IC chips 112 may be further tested after completion of the burn-in process. Such testing may be very sophisticated and complex, providing a thorough test to ensure that all subunits 108 of the IC chip 112 are properly functioning. Those IC chips 112 passing final testing are then attached to a circuit board 114 with other devices 116.

Detected output signals may be processed and saved as test output data during the above-described testing wherein electronic input signals are applied to the semiconductor device 102, to the IC chip 112, or to discrete subunits 108. The saved test data may be archived for later analysis.

SUMMARY

A system and method for analysis of cache array test data are described. One embodiment comprises retrieving test results for a current period of time for a first plurality of storage elements and for a historical period of time for a second plurality of storage elements; determining a plurality of attributes for each of the first storage elements and the second storage elements based upon the test results, the attributes comprising one of a good condition, a defective condition, a repairable condition and a repaired condition; determining a plurality of attribute statistics corresponding to the attributes of the first storage elements and the second storage elements; and generating an output report indicating at least two of the attribute statistics of the first storage elements and the second storage elements.

Another embodiment comprises test data corresponding to testing of at least one cache array residing on a semiconductor device; a processor configured to execute logic; and a memory with the logic configured to: analyze the test data for a current period of time for a first plurality of storage elements having a common function and residing in at least one first cache array; analyze the test data for a historical period of time for a second plurality of storage elements having the common function and residing in at least one second cache array; determine a plurality of attributes for each of the first storage elements and each of the second storage elements based upon the test data, the attributes comprising one of a good condition, a defective condition, a repairable condition and a repaired condition; determine a plurality of attribute statistics corresponding to the attributes of the first storage elements and the second storage elements; and generate an output report indicating at least two of the attributes of the first plurality of storage elements and the second plurality of storage elements, and the corresponding attribute statistics.

BRIEF DESCRIPTION OF THE DRAWINGS

The components in the drawings are not necessarily to scale relative to each other. Like reference numerals designate corresponding parts throughout the several views.

FIG. 2 is a simplified exemplary block diagram of a semiconductor device having a cache memory, a processor and at least one subunit.

FIG. 4 is an illustrative output report prepared by embodiments of the cache array test data analysis system.

DETAILED DESCRIPTION

Figure 1:
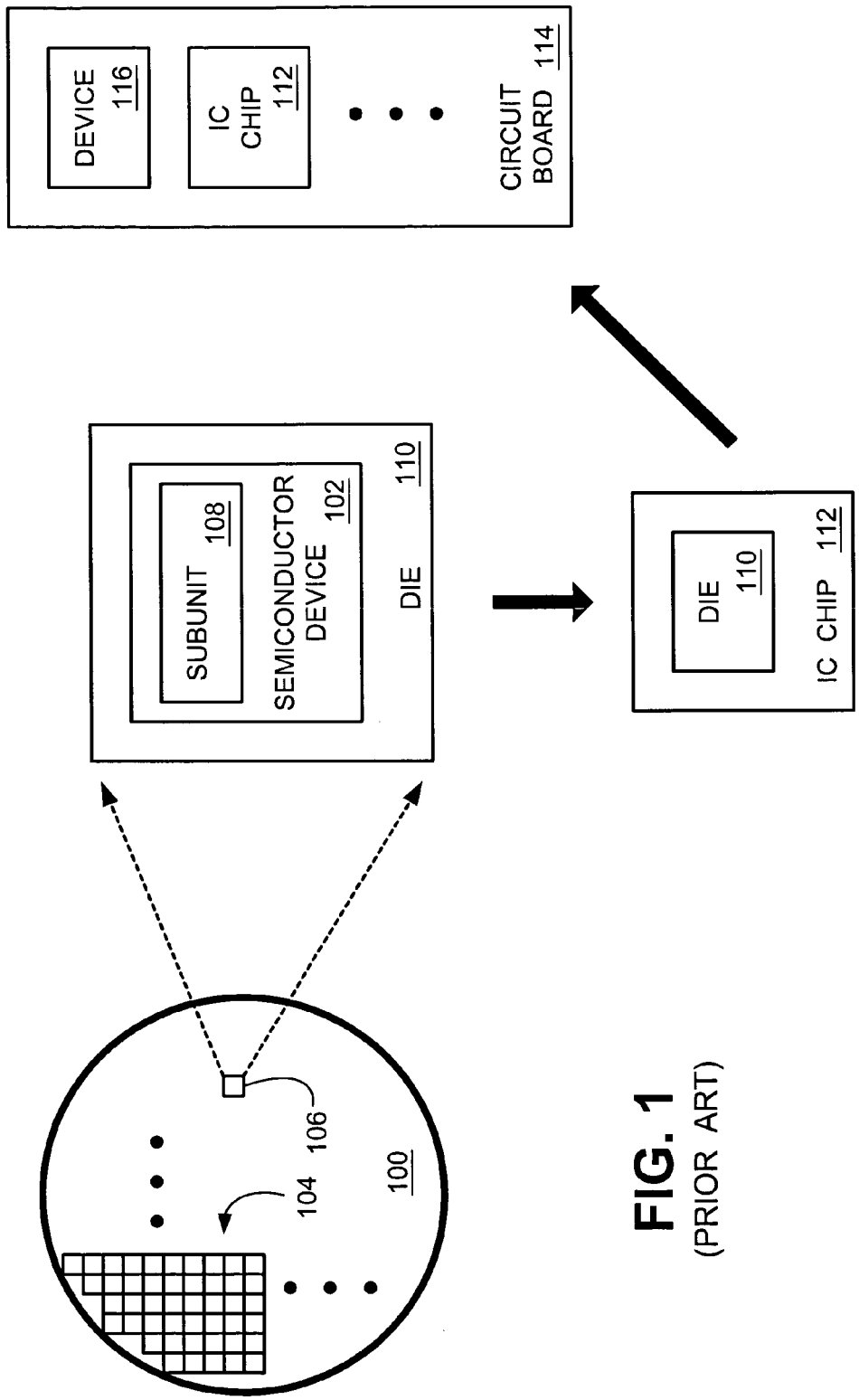
FIG. 1 is a simplified exemplary diagram of a fabricated wafer having a plurality of semiconductor devices occupying regions of the wafer.

Embodiments of the cache array test data analysis system 300 (FIG. 3) related to integrated circuit semiconductor device fabrication and testing and, more particularly, is related to a system and method for presentation of cache array fabrication history based upon analysis of cache array test data. The cache array test data analysis system 300 analyzes cache array test data from a plurality of cache memories 202 (FIG. 2), and presents a comparison of current fabrication statistics and historical fabrication attribute statistics for portions of cache arrays 206. In one embodiment, statistical information corresponding to good, repaired and/or repairable, and defective portions of cache arrays 206 fabricated during the current period is compared to acceptable, repaired or repairable, defective portions of cache arrays 206 fabricated during the historical period is presented. Accordingly, many wafers 100 can be analyzed based upon cache array test data. As used herein, an attribute is defined as being the tested condition (good, repaired and/or repairable, and defected) of a tested portion of a cache array 206.

The current period is defined as a relatively recent period of time wherein fabrication results of one or more cache arrays 206 are of interest. Cache arrays 206 fabricated during the current period and the historical period are tested. The test data is analyzed, and statistical data associated with the attributes are compared in an output report 402 (FIG. 4). The historical period is defined as a past period of time wherein fabrication results of one or more different cache arrays 206 are of interest. For example, a current period of the most recent week may be specified, and a historical period of the prior 51 weeks may be specified. It is understood that the current period and the historical period can be selected as any suitable test period, and may be specified by any suitable indicia (date, minute, hour, day, month and/or year). Furthermore, periods may be specified by other suitable indicia, such as, but not limited to, predefined location (s) on a wafer, wafer lot number, wafer fabrication unit, fabrication plant, supplier, vendor, cache memory type, cache array type and/or die type.

FIG. 2 is a simplified exemplary block diagram of a semiconductor device 102 having a cache memory 202, a processor 204 and at least one subunit 108. Cache memory 202 comprises at least one cache array 206. A cache array 206 is a region of the cache memory 202. Cache arrays 206 are designed into a cache memory 202 to facilitate programming functions. For example, processor 204, while executing instructions and process various data, uses cache memory 202 as a memory device.

Cache memory 202 is a volatile memory device configured to store data as required by processor 204. Cache arrays 206 improve operational efficiency of processor 204 since the cache arrays 206 have predefined locations on the cache memory 202, thereby enabling the use of pointers or the like by logic executed by processor 204 to identify precisely where data has been stored into cache memory 202. Thus, pointers facilitate quicker storage and/or access of data that is saved into a cache array 206.

A cache memory 202 contains many small transistor-based storage elements 208 that store one bit of data. For example, a group of field effect transistors and other devices may be fabricated onto a semiconductor device 102 such that one bit of data may be stored into the cache memory 202. By fabricating thousands, or even millions, of these small transistor-based storage elements 208 onto a cache memory 202, the cache memory 202 may be configured to store a large amount of data. During fabrication, regions of the cache memory 202 having a relatively large number of small transistor-based storage elements 208 are defined as a cache array 206.

Portions of cache array 206 are defined to store data, referred to as "data-data even" or "data-data odd" portions. Data-data even and data-data odd may save the same data, thereby providing redundancy. Other portions of cache array 206 are defined to store identifiers, such as pointers, referred to as "data-tag even" or "data-tag odd" portions. Data-tag even and data-tag odd point to their respective data-data even and data-data odd portions. Other portions of cache array 206 are defined to store instructions executed by a processor, referred to as "instruction tag" portions.

During fabrication of a cache memory 202, the cache memory 202 may be designed to have a plurality of cache arrays 206 to provide redundancy in the event that one or more of the cache arrays 206 are defective. Accordingly, the many small transistor-based storage elements 208 are individually tested to ensure that data can be saved into and retrieved from each portion of a cache array 206. In the event that one or more of the storage elements 208 do not operate properly, the cache array 206 may be reconfigured such that a defective storage element 208 is not used. If a great enough number of the storage elements 208 are defective, the corresponding cache array 206 may be disabled and another properly functioning cache array 206 is substituted in its place. Accordingly, extra cache arrays 206 are fabricated into the cache memory 202 for later use if needed to replace defective cache array.

Figure 3:
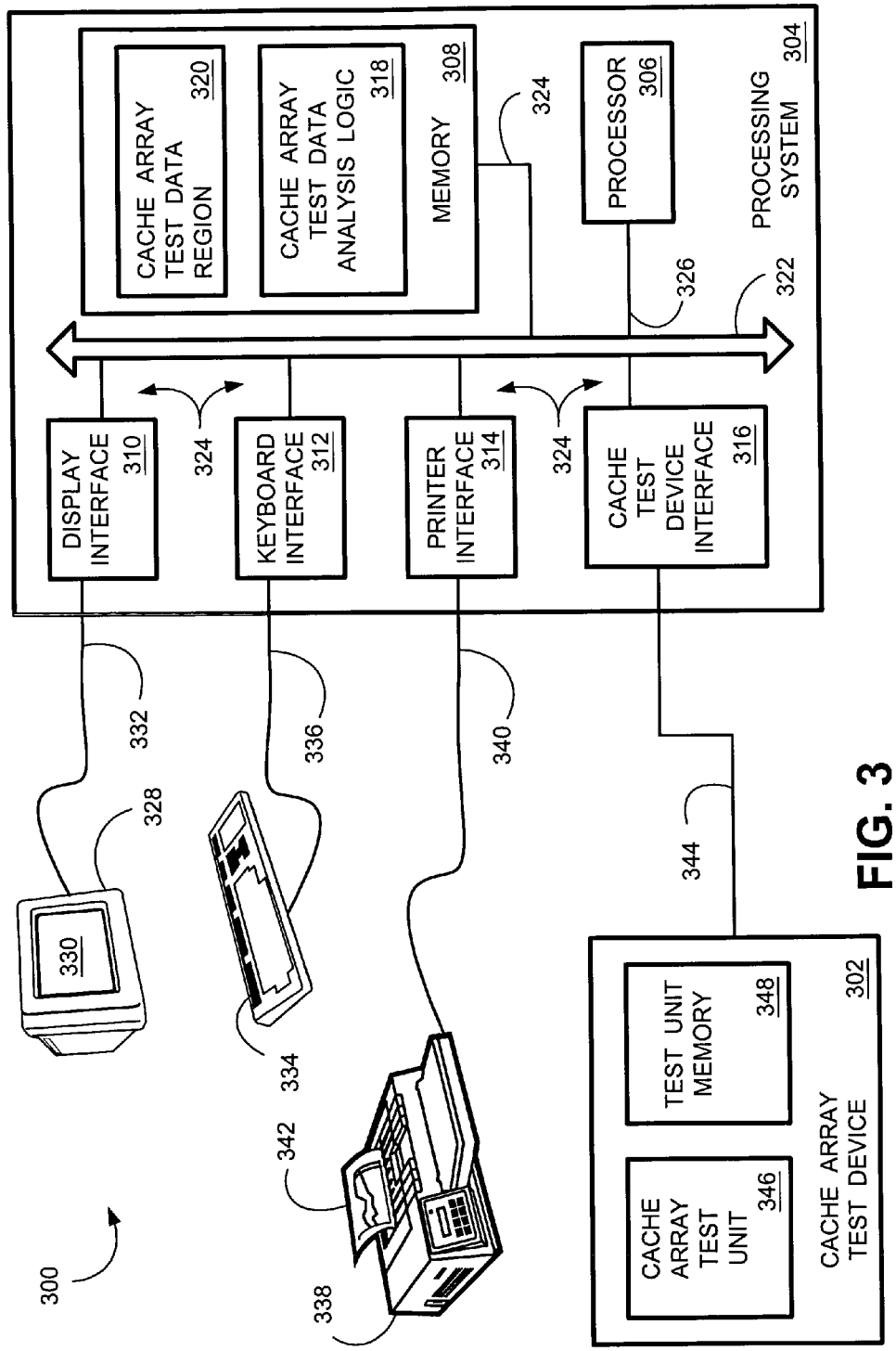
FIG. 3 is a simplified exemplary block diagram of a cache array test data analysis system coupled to a cache test device.

FIG. 3 is a simplified exemplary block diagram of a cache array test data analysis system 300 coupled to a cache array test device 302. One embodiment of cache array test data analysis system 300 is a processing system 304 comprising a processor 306, a memory 308, display interface 310, keyboard interface 312, printer interface 314 and cache array test device interface 316. Memory 308 may further include a cache test data region 318 and a cache array test data analysis logic 320.

Memory 308, display interface 310, keyboard interface 312, printer interface 314, and cache array test device interface 316 are coupled to communication bus 322 via connections 324. Communication bus 322 is coupled to processor 306 via connection 326, thereby providing connectivity to the above-described components. In alternative embodiments of processing system 304, the above-described components are connectivley coupled to processor 306 in a different manner than illustrated in FIG. 3. For example, one or more of the above-described components may be directly coupled to processor 306 or may be coupled to processor 306 via intermediary components (not shown).

The above-described interfaces 310, 312, 314 and 316 are configured to exchange information from processing system 304 and their respective connected device. For example, display interface 310 is configured to interface between processing system 304 and display device 328 such that an output report 402 (FIG. 4) is displayed on display 330.

Keyboard interface 312 is configured to receive operating instructions from a keyboard 334, via connection 336. For example, a user may specify the current period and/or the historical period using keyboard 334. Printer interface 314 is configured to communicate graphics data from processing system 306 to printer 338, via connection 340, such that an output report 402 is printed on printer 338. Cache array test device interface 316 is configured to receive test data corresponding to cache array tests, via connection 344.

For convenience, connections 332, 336, 340 and 344 are illustrated as hardwire connections. Any one of the connections 332, 336, 340 and/or 344 may be implemented with other suitable media, such as infrared, optical, wireless or the like. In other embodiments, the interfaces 310, 312, 314 and 316 are implemented as part of another component residing in processing system 304, such as part of processor 306.

Cache array test device 302 may include a cache array test unit 346 configured to test cache arrays 206 (FIG. 2). Test data resulting from cache array testing is stored in test unit memory 348. Alternatively, the test data may be communicated directly to the cache array test data region 320 of memory 308.

Any suitable cache array test device 302 may be used for testing storage elements 208 (FIG. 2) of a cache array 206. For example, a device configured to perform bit checking and/or bit flipping may be used to test individual storage elements 208 of a cache array 206.

The resultant test data associated with testing cache arrays 206 is very large and complex. The amount of test data is dependent upon the number of storage elements 208 in a tested cache array 206, the number of cache arrays 206 in a tested cache memory 202, and the number of cache memories 202 in a device under test (DUT). The DUT comprises the various devices residing on an individual die.

Furthermore, the amount of test data is dependent upon the number of DUTs tested. For example, all dies from a single wafer 100 (FIG. 1) which are believed to be good are tested to determine if the arrays 206 and the cache memories 202 are properly functioning. In that event, many hundreds of cache arrays 206 are tested. If all dies 110 from a plurality of like wafers 100 are tested, even more cache memories 202 would be tested. The plurality of like wafers 100 may be from one or more production runs, or may be produced during a specified period of time.

Testing of the cache arrays 206 may be done before singulation of wafer 100 (before dies are cut from the wafer 100). Or, testing of the cache arrays 206 may be done while the die 110 is on the IC chip 112 (FIG. 1). Or, testing of the arrays 206 may be done while the IC chip 112 in on the circuit board 114. It is understood that testing of arrays 206, and the saving of the resultant test data, may be done at any convenient time during the fabrication process and may be done with any suitable testing device now known or later developed.

As noted above, the saved resultant test data, determined by analyzing the cache array test data and which corresponds to a particular set of tested cache arrays 206, comprises a very large amount of information. This large amount of information is very unwieldy and difficult to process. If manually processed, the information may be difficult to understand and interpret.

The above-described cache array test data indicates performance of individual storage, elements 208. However, other associated information may also be included in the cache array test data. For example, associated information may include identification of the cache array 206 of the DUT, and identification of portions of the cache array 206 where the storage elements 208 reside. And, identifiers of the DUT and/or location of the DUT may be included in the cache array test data as information. Furthermore, an identifier may be included in the cache array test data which identifies the wafer from which the die came from (or an identifier identifying dies originating from a common wafer), the fabrication date, the fabrication run, the fabrication machine and/or other information of interest.

Thus, embodiments of the cache array test data analysis system 300 are configured to process the test information into information that is readily understandable to a person. Furthermore, the test data processed by embodiments of the cache array test data analysis system 300 are configured to generate output report 402. Output report 402, when displayed and/or printed, indicates statistics related to fabrication of dies 110 that have good and/or defective cache arrays 206 on the dies 110. Or, a group of wafers 100 may be further analyzed such that a statistical composite output report 402 is generated. The output report 402 provides an easily understood summarization of the quality of portions of cache arrays 206. Accordingly, the associated quality of production of semiconductor devices 102 and/or wafers 100 may be inferred. That is, a displayed output report 402 indicating no (or relatively few) defective portions of the tested cache arrays 206 tends to imply an acceptable quality in the fabrication process. On the other hand, a displayed output report 402 indicating many (or relatively many) defective portions of the tested cache arrays 206 tends to imply an unacceptable quality in the fabrication process.

FIG. 4 is an illustrative output report 402 prepared by embodiments of the cache array test data analysis system 300. Based upon test results identifying acceptable, repaired, and/or defective cache arrays 206 (FIG. 2), analysis results are categorized based upon the functional nature (attribute) of the storage elements 208 (FIG. 2) in a cache array 206. For example, one embodiment categorizes test results by storage elements that are designed for storing data, such as "data-data even," "data-data odd," "instruction-data even," or "instruction-data odd." Test results are also categorized by the pointer functionality described above, such as "data-tag even," or "data-tag odd," or by operating functionality, such as "instruction tag."

Once storage elements 208 in a cache array 206 are categorized by function, test result data is processed to determine the attribute statistics of the storage elements 208 in a tested cache array 206. For example the percentage of acceptable, repaired, and/or defective portions (data-data even, data-data odd, instruction-data even, instruction-data odd, data-tag even, data-tag odd and instruction tag) are determined. For example, one of the percentages indicate the percent of acceptable data-even tags in the tested cache array(s) 206 in the defined current period.

The exemplary embodiment of output report 402 displays the statistical data of the current period as bars, and the statistical data of the historical period as lines with indicia. Labels 404 indicate the type of portions of the tested cache array 206, where the portion type is defined by the designed functionality of the storage element 208. Thus, the label "data-tag even" corresponds to test results from storage elements 208 (FIG. 2) having the functionality of storing information corresponding to the data-tag even portion.

Bar 406 indicates the percentage of data-tag even portions of cache arrays 206 that tested as acceptable during the current period. Bar 408 indicates the percentage of data-tag even portions that tested as repaired and/or repairable during the current period. In the illustrative embodiment, no bar is used to indicate the percentage of data-tag even portions that tested as defective, since it is understood that the remaining percentage is defective.

To facilitate interpretation of the output report 402, a per-unit scale 410 is shown. Thus, it is understood that the indicia "0.8" corresponds to a statistical value of eight percent (80%). Thus, a viewer of output report can quickly discern that 60% of the data-tag even portions tested as acceptable, that 20% of the data-tag even portions tested as repaired and/or repairable, and that the remaining 20% of the data-tag even portions tested as defective (100%−80%−20%=20%) in the exemplary output report 402.

Indicia 412 indicates the percentage of data-tag even portions that tested as acceptable during the historical period. Indicia 414 indicates the percentage of data-tag even portions that tested as repaired and/or repairable during the historical period. In the illustrative embodiment, no bar is used to indicate the percentage of data-tag even portions that tested as defective, since it is understood that the remaining percentage is defective.

Similarly, bar 416 indicates the percentage of data-tag odd portions that tested as acceptable during the current period and bar 418 indicates the percentage of data-tag odd portions that tested as repaired and/or repairable during the current period. Indicia 420 indicates the percentage of data-tag odd portions that tested as acceptable during the historical period and indicia 422 indicates the percentage of data-tag odd portions that tested as repaired and/or repairable during the historical period.

Bar 424 indicates the percentage of data-data even portions that tested as acceptable during the current period and bar 426 indicates the percentage of data-data even portions that tested as repaired and/or repairable during the current period. Indicia 428 indicates the percentage of data-data even portions that tested as acceptable during the historical period and indicia 430 indicates the percentage of data-data even portions that tested as repaired and/or repairable during the historical period.

Bar 432 indicates the percentage of data-data even portions that tested as acceptable during the current period and bar 434 indicates the percentage of data-data even portions that tested as repaired and/or repairable during the current period. Indicia 436 indicates the percentage of data-data even portions that tested as acceptable during the historical period and indicia 438 indicates the percentage of data-data even portions that tested as repaired and/or repairable during the historical period.

Bar 440 indicates the percentage of instruction tag portions that tested as acceptable during the current period and bar 442 indicates the percentage of instruction tag portions that tested as repaired and/or repairable during the current period. Indicia 444 indicates the percentage of instruction tag portions that tested as acceptable during the historical period and indicia 446 indicates the percentage of instruction tag portions that tested as repaired and/or repairable during the historical period.

To facilitate understanding of the statistics presented in output report 402, an optional line 448 connecting the historical points 412, 420, 428 and 444 is shown. Thus, the viewer is aided in visually discerning the acceptable portions tested during the historical period. Similarly, optional line 450 connecting the historical points 414, 422, 430 and 446 is shown. Thus, the viewer is aided in visually discerning the repaired and/or repairable cache arrays 206 tested during the historical period.

For convenience, the repaired and/or repairable portions were illustrated as one category. In another embodiment, the repaired and repairable portions are shown as separate categories. In another embodiment, either the repaired or repairable portions are shown as a category.

In one embodiment, a legend 452 may be included. Legend 452 comprises information of interest. For example, the legend 452 may identify attributes and/or their associated statistics for the current and historical periods. Or, legend 452 may more specifically identify characteristics of the bars, indicia and/or lines. It is understood that any suitable information of interest may be included in legend 452.

For convenience, the exemplary output report 402 is presented in a black-and-white format. Colors may be used in other embodiments to further highlight the statistical information presented in the output report 402. Furthermore, shadings may be used on the bars 406, 408, 416, 418, 424, 426, 432, 440 and 442. Also, various line types, thicknesses and/or styles may be used for lines 448 and 450.

It is understood that any suitable symbology and/or nomenclature may be used on output report 402. For example, statistics of the attributes (acceptable; repaired or repairable; defective) of tested portions of the cache arrays 206 could be represented using a pie-chart. Or, fabricated cache arrays (acceptable; repaired or repairable; defective) could be represented using a three-dimensional (3-D) chart. Accordingly, a viewer of such embodiments of an output report 402 can readily and quickly identify fabrication of acceptable, repaired or repairable, defective portions of cache arrays 206 fabricated during the current period, and compare with the attribute statistics of the historical period.

As described above, a per-unit scale 410 is shown on the exemplary output report 402. Any suitable statistical descriptor or indicia may be used. For example, a percentage indicia could be used. Thus, the "0.8" per unit indicia could be replaced with the "80%" indicia. Mean, mode, average, standard deviation or other statistical information could also be presented on alternative embodiments of output report 402.

Output report 402 is determined from analysis of cache array test data described above. The cache array test data may reside in test unit memory 348 and/or in the cache array test data region of memory 308. When a user desires to view an output report 402, the user causes processor 306 to retrieve and execute cache array test data analysis logic 318 (FIG. 3). Processor 306 retrieves the cache array test data and generates an cache array analysis data file that is used to construct the output report 402.

The constructed cache array analysis data file may be saved for further analysis or reference at a later time. The cache array analysis data file may be saved into a suitable region of memory 308, or saved to another suitable memory.

Figure 5:
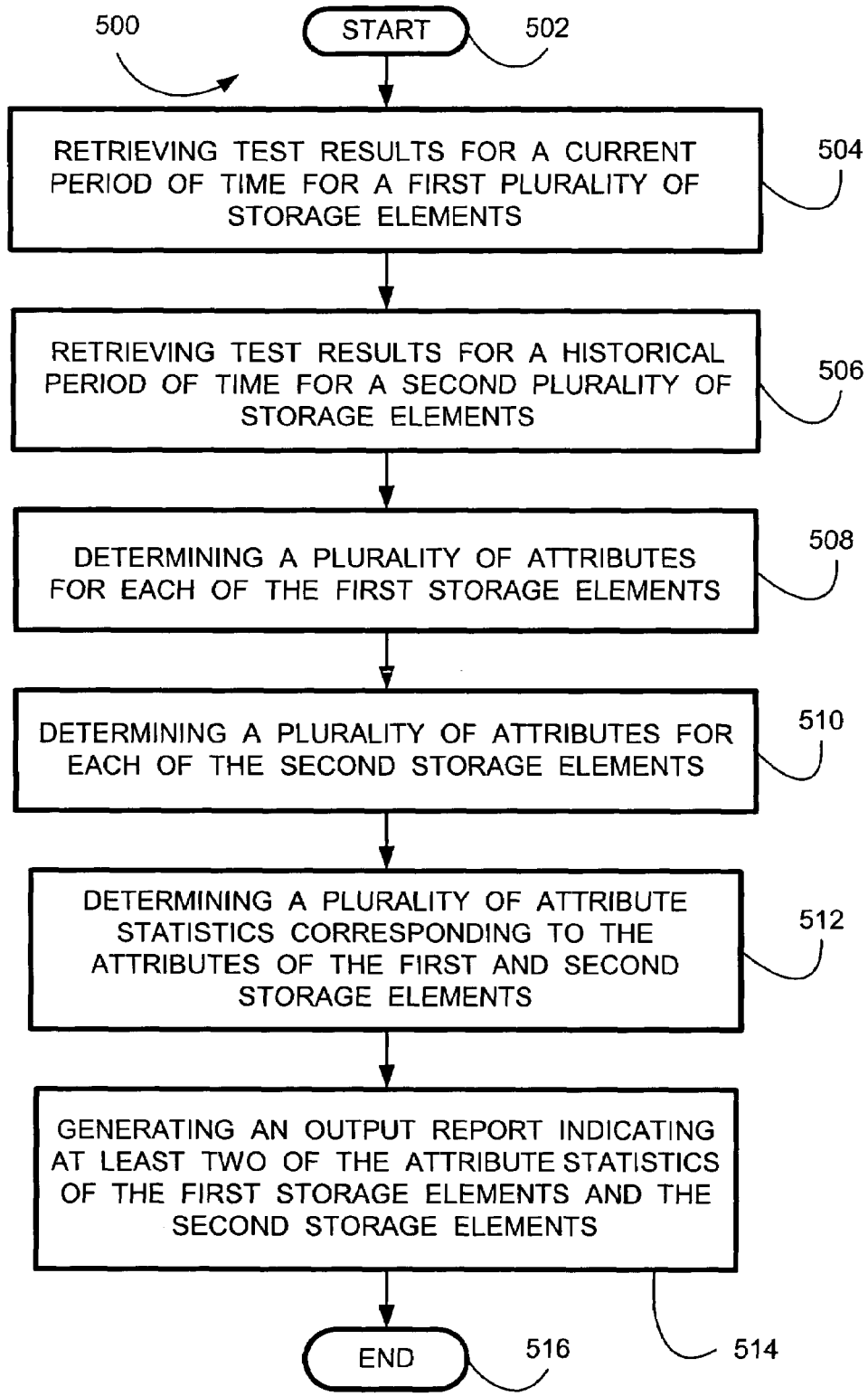
FIG. 5 shows a flow chart illustrating a process for an embodiment of the cache array test data analysis system.

FIG. 5 shows a flow chart 500 illustrating a process for an embodiment of the cache array test data analysis system 300 (FIG. 3). The flow chart 500 shows the architecture, functionality, and operation of an embodiment for implementing the cache array test data analysis logic 318 such that test data from a plurality of tested cache arrays 206 (FIG. 2) are analyzed, and corresponding regions of the wafer 100 (FIG. 1) that are good, repaired and/or repairable, and/or defective semiconductor devices 102 residing on a wafer 100 (FIG. 1) can be identified. An alternative embodiment implements the logic of flow chart 500 with hardware configured as a state machine. In this regard, each block may represent a module, segment or portion of code, which comprises one or more executable instructions for implementing the specified logical function(s). It should also be noted that in some alternative implementations, the functions noted in the blocks may occur out of the order noted in FIG. 5, or may include additional functions. For example, two blocks shown in succession in FIG. 5 may in fact be substantially executed concurrently, the blocks may sometimes be executed in the reverse order, or some of the blocks may not be executed in all instances, depending upon the functionality involved, as will be further clarified hereinbelow. All such modifications and variations are intended to be included herein.

The process begins at block 502. At block 504, test results for a current period of time for a first plurality of storage elements is retrieved. At block 506, the test results for a historical period of time for a second plurality of storage elements is retrieved. At block 508, a plurality of attributes for each of the first storage elements, based upon the test results, is determined, wherein the attributes comprise one of a good condition, a defective condition, a repairable condition and a repaired condition. At block 510, the plurality of attributes for each of the second storage elements based upon the test results is determined. At block 512, a plurality of attribute statistics corresponding to the attributes of the first storage elements and the second storage elements is determined. At block 514, an output report indicating at least two of the attribute statistics of the first storage elements and the second storage elements is generated. The process ends at block 516.

Embodiments implemented in memory 308 (FIG. 3) may be implemented using any suitable computer-readable medium. In the context of this specification, a "computer-readable medium" can be any means that can store, communicate, propagate, or transport the data associated with, used by or in connection with the instruction execution system, apparatus, and/or device. The computer-readable medium can be, for example, but not limited to, an electronic, magnetic, optical, electromagnetic, infrared, or semiconductor system, apparatus, device, or propagation medium now known or later developed.

For convenience, the embodiment of cache array test data analysis system 300 (FIG. 3) is illustrated as residing in processing system 304. Processing system 304 may be any suitable processing system, such as, but not limited to, a work station, a mainframe computer, a personal computer, a laptop computer or a special purpose processing device. Furthermore, other embodiments of a cache array test data analysis system may be implemented as an integral part of a cache array test device or another testing system that is configured to test cache memory arrays. Such testing devices may also be configured to test other components of a wafer(s), die(s), IC chip(s) and/or circuit board(s).

The output report 402 (FIG. 4) is illustrated as a graphically based report that is viewable on a display or that is printable in hardcopy form. Accordingly, some embodiments of the cache array test data analysis logic 318 may include logic configured to generate graphical output files suitable for display and/or printing. For example, a graphical description file (gdf) could be used to format output report 403. In another embodiment, a suitable spread sheet program may be configured to receive cache array test data directly, or analyzed data from the cache array test data analysis system 300, and generate output report 402. It is understood that any suitable output format for displaying and/or printing a graphical based output file may be used by embodiments of a cache array test data analysis system 300.

It should be emphasized that the above-described embodiments are merely examples of implementations. Many variations and modifications may be made to the above-described embodiments. All such modifications and variations are intended to be included herein within the scope of the following claims.

What is claimed is:

1. A system which analyzes cache array test data, comprising:
   test data corresponding to testing of at least one cache array residing on a semiconductor device;
   a processor configured to execute logic; and
   a memory with the logic configured to:
      analyze the test data for a current period of time for a first plurality of storage elements having a common function and residing in at least one first cache array;
      analyze the test data for a historical period of time for a second plurality of storage elements having the common function and residing in at least one second cache array;
      determine a plurality of attributes for each of the first storage elements and each of the second storage elements based upon the test data, the attributes comprising one of a good condition, a defective condition, a repairable condition and a repaired condition;
      determine a plurality of attribute statistics corresponding to the attributes of the first storage elements and the second storage elements; and
   generate an output report indicating at least two of the attributes of the first plurality of storage elements and the second plurality of storage elements, and the corresponding attribute statistics;
   wherein, in generating the output report, the attributes of the first plurality of storage elements are indicated with a bar and the attributes of the second plurality of storage elements are indicated with an indicia.

2. The system of claim 1, further comprising a cache array test device configured to test the at least one cache array of the semiconductor device.

3. The system of claim 2, wherein the cache array test device further comprises a cache array test unit configured to test a plurality of cache arrays when the semiconductor device resides on a wafer.

4. The system of claim 2, wherein the cache array test device further comprises a cache array test unit configured to test a plurality of cache arrays when the semiconductor device resides on a die.

5. The system of claim 2, wherein the cache array test device further comprises a cache array test unit configured to test a plurality of cache arrays when the semiconductor device resides on an integrated circuit chip.

6. The system of claim 2, wherein the cache array test device further comprises a cache array test unit configured to test a plurality of cache arrays when the semiconductor device resides on a circuit board.

7. A method for analysis of cache array test data, the method comprising:
   retrieving test results for a current period of time for a first plurality of storage elements and for a historical period of time for a second plurality of storage elements;
   determining a plurality of attributes for each of the first storage elements and the second storage elements based upon the test results, the attributes comprising one of a good condition, a defective condition, a repairable condition and a repaired condition;
   determining a plurality of attribute statistics corresponding to the attributes of the first storage elements and the second storage elements; and
   generating an output report indicating at least two of the attribute statistics of the first storage elements and the second storage elements;
   wherein generating the output report further comprises:
   indicating the attributes of the first plurality of storage elements with a bar; and indicating the attributes of the second plurality of storage elements with an indicia.

8. The method of claim 7, wherein the first storage elements have a common function and reside in at least one first cache array, and wherein the second storage elements have the common function and reside in at least one second cache array.

9. The method of claim 8, wherein generating the output report further comprises indicating the common function of the first storage elements and second storage elements.

10. The method of claim 7, wherein generating the output report further comprises indicating the corresponding attributes for each of the attribute statistics.

11. The method of claim 7, wherein generating the output report further comprises indicating the good condition attribute, the defective condition attribute and the repaired condition attribute.

12. The method of claim 7, wherein generating the output report further comprises indicating the good condition attribute, the defective condition attribute and the repairable condition attribute.

13. The method of claim 7, further comprising displaying the output report on a display.

14. The method of claim 7, further comprising printing the output report.

15. A method for analysis of cache array test data, the method comprising:
retrieving test results for a current period of time for a first plurality of storage elements and for a historical period of time for a second plurality of storage elements;
determining a plurality of attributes for each of the first storage elements and the second storage elements based upon the test results, the attributes comprising one of a good condition, a defective condition, a repairable condition and a repaired condition;
determining a plurality of attribute statistics corresponding to the attributes of the first storage elements and the second storage elements;
generating an output report indicating at least two of the attribute statistics of the first storage elements and the second storage elements;
retrieving the test results for the current period of time for a third plurality of storage elements;
retrieving the test results for the historical period of time for a fourth plurality of storage elements;
determining the plurality of attributes for each of the third storage elements and the fourth storage elements based upon the test results;
determining the attribute statistics corresponding to the attributes of the third storage elements and the fourth storage elements; and
generating the output report indicating at least two of the attributes of the third storage elements and the fourth storage elements.

16. The method of claim 15, wherein generating the output report further comprises:
indicating the attributes of the first plurality of storage elements with a bar; and
indicating the attributes of the second plurality of storage elements with an indicia.

17. The method of claim 15, wherein the first storage elements and the second storage elements have a common first function, wherein the third storage elements and the fourth storage elements have a common second function, wherein the first storage elements and the third storage elements reside in at least one first cache array, and wherein the second storage elements and the fourth storage elements reside in at least one second cache array.

18. The method of claim 17, wherein generating the output report further comprises:
indicating the attributes and the common first function of the first plurality of storage elements with a first bar;
indicating the attributes of the second plurality of storage elements with a first indicia, the first indicia displayed with the first bar;
indicating the attributes and the common second function of the third plurality of storage elements with a second bar; and
indicating the attributes of the fourth plurality of storage elements with a second indicia, the second indicia displayed with the second bar.

19. The method of claim 18, further comprising displaying a line on the output report, the line connecting the first indicia and the second indicia.

20. A method for analysis of cache array test data, the method comprising:
retrieving test results for a current period of time for a first plurality of storage elements and for a historical period of time for a second plurality of storage elements;
determining a plurality of attributes for each of the first storage elements and the second storage elements based upon the test results, the attributes comprising one of a good condition, a defective condition, a repairable condition and a repaired condition;
determining a plurality of attribute statistics corresponding to the attributes of the first storage elements and the second storage elements;
generating an output report indicating at least two of the attribute statistics of the first storage elements and the second storage elements; and
displaying a legend on the output report, the legend identifying at least one of: a semiconductor device type corresponding to where the first cache array and the second cache array reside; a wafer type corresponding to where the first cache array and the second cache array reside; and a die type corresponding to where the first cache array and the second cache array reside.

21. A computer-readable medium having a program for analysis of cache array test data, the program comprising logic configured to:
analyze a first cache array test data for a first plurality of storage elements having a common function and residing in at least one first cache array, the first cache array test data corresponding to a current period of time;
analyze a second cache array test data for a second plurality of storage elements having the common function and residing in at least one second cache array, the second cache array test data corresponding to a historical period of time;
determine a plurality of attributes for each of the first storage elements based upon the first cache array test data, the attributes comprising one of a good condition, a defective condition, a repairable condition and a repaired condition;
determine the plurality of attributes for each of the second storage elements based upon the second cache array test data;
determine a plurality of attribute statistics corresponding to the attributes of the first storage elements and the second storage elements;
generate an output report indicating at least two of the attributes of the first storage elements and the second storage elements, and indicating the corresponding attribute statistics for each of the attributes; and display a legend on the output report, the legend identifying at least one of: a semiconductor device type corresponding to where the first cache array and the second cache array reside; a wafer type corresponding to where the first cache array and the second cache array reside; and a die type corresponding to where the first cache array and the second cache array reside.

22. The computer-readable medium of claim 21, wherein the logic for generating further comprises logic configured to indicate the common function.

23. A system for analysis of cache array test data, comprising:

means for analyzing a first cache array test data corresponding to test results of a first plurality of storage elements having a common function and residing in at least one first cache array, the first cache array test data corresponding to a current period of time;

means for analyzing a second cache array test data corresponding to test results of a second plurality of storage elements having the common function and residing in at least one second cache array, the second cache array test data corresponding to a historical period of time;

means for determining a plurality of attributes for each of the first storage elements based upon the first cache array test data, the attributes comprising one of a good condition, a defective condition, a repairable condition and a repaired condition;

means for determining the plurality of attributes for each of the second storage elements based upon the second cache array test data;

means for determining a plurality of attribute statistics corresponding to the attributes of the first storage elements and the second storage elements;

means for generating an output report indicating the common function of at least two of the attributes of the first storage elements and the second storage elements, and the corresponding attribute statistics for each of the attributes; and means for displaying a legend on the output report, the legend identifying at least one of: a semiconductor device type corresponding to where the first cache array and the second cache array reside; a wafer type corresponding to where the first cache array and the second cache array reside; and a die type corresponding to where the first cache array and the second cache array reside.

* * * * *